United States Patent
Zhan

(10) Patent No.: US 9,677,930 B2
(45) Date of Patent: Jun. 13, 2017

(54) METHOD OF INTERRUPT CONTROL AND ELECTRONIC SYSTEM USING THE SAME

(71) Applicant: LITE-ON SEMICONDUCTOR CORPORATION, New Taipei (TW)

(72) Inventor: Peng-Han Zhan, New Taipei (TW)

(73) Assignee: Dyna Image Corporation, New Taipei (TW)

( * ) Notice: Subject to any disclaimer, the term of this patent is extended or adjusted under 35 U.S.C. 154(b) by 265 days.

(21) Appl. No.: 14/156,453

(22) Filed: Jan. 16, 2014

(65) Prior Publication Data
US 2014/0325108 A1    Oct. 30, 2014

Related U.S. Application Data

(60) Provisional application No. 61/817,306, filed on Apr. 29, 2013.

(30) Foreign Application Priority Data

Sep. 23, 2013  (CN) .......................... 2013 1 0444355

(51) Int. Cl.
*G06F 13/24* (2006.01)
*G01J 1/42* (2006.01)
(Continued)

(52) U.S. Cl.
CPC ............... *G01J 1/42* (2013.01); *G01S 7/4813* (2013.01); *G01S 17/50* (2013.01); *G06F 3/0304* (2013.01);
(Continued)

(58) Field of Classification Search
USPC ............................ 710/260–269; 702/85, 86
See application file for complete search history.

(56) References Cited

U.S. PATENT DOCUMENTS 4,866,571 A    9/1989 Butt
5,317,149 A    5/1994 Uebbing
(Continued)

FOREIGN PATENT DOCUMENTS

CN    1525206 A    9/2004
CN    1737766 A    2/2006
(Continued)

OTHER PUBLICATIONS

SFH 7773 (IR-LED+Proximity Sensor+Ambient Light Sensor), Application note preliminary, Dec. 12, 2011, pp. 1-23, Opto Semiconductors, OSRAM, XP055111379.

*Primary Examiner* — Khanh Dang
(74) *Attorney, Agent, or Firm* — Winston Hsu; Scott Margo

(57) ABSTRACT

A method of interrupt control for a control unit of an electronic system includes receiving digital data; determining a value of the digital data; and sending interrupt signals to a host by the following methods according to the value: when the control unit is in a second signal sending status and after the value of the digital data increases to be greater than a first threshold and remains greater than the first threshold for a first period of time, switching the control unit to a first signal sending status; and when the control unit is in the first signal sending status and after the value of the digital data decreases to be smaller than a second threshold and remains smaller than the second threshold for a second period of time, switching the control unit to the second signal sending status. The second threshold is smaller than the first threshold.

12 Claims, 4 Drawing Sheets

(51) Int. Cl.
*H01L 25/00* (2006.01)
*H01L 25/16* (2006.01)
*H05K 13/04* (2006.01)
*H01L 31/0232* (2014.01)
*G06F 3/0354* (2013.01)
*G06K 9/60* (2006.01)
*G06T 5/00* (2006.01)
*G01S 7/481* (2006.01)
*G01S 17/50* (2006.01)
*G06F 3/03* (2006.01)
*H01L 27/146* (2006.01)

(52) U.S. Cl.
CPC ........ *G06F 3/0354* (2013.01); *G06F 3/03547* (2013.01); *G06F 13/24* (2013.01); *G06K 9/60* (2013.01); *G06T 5/008* (2013.01); *H01L 25/167* (2013.01); *H01L 25/50* (2013.01); *H01L 31/02327* (2013.01); *H05K 13/046* (2013.01); *G01J 2001/4295* (2013.01); *H01L 27/14618* (2013.01); *H01L 27/14625* (2013.01); *H01L 2224/05554* (2013.01); *H01L 2224/48091* (2013.01); *H01L 2224/48247* (2013.01)

(56) References Cited

U.S. PATENT DOCUMENTS

| | | | |
|---|---|---|---|
| 7,046,344 B2 | 5/2006 | Yamamoto | |
| 7,103,693 B2 * | 9/2006 | Anand et al. | 710/260 |
| 7,215,010 B2 | 5/2007 | Bast | |
| 7,309,855 B2 | 12/2007 | Nagasaka | |
| 7,348,957 B2 * | 3/2008 | Cui et al. | 345/102 |
| 7,617,980 B2 | 11/2009 | Saxena | |
| 7,763,841 B1 | 7/2010 | McEldowney | |
| 7,842,957 B2 | 11/2010 | Goh | |
| 8,068,641 B1 | 11/2011 | Hildreth | |
| 8,304,850 B2 | 11/2012 | Lazarov | |
| 8,604,436 B1 | 12/2013 | Patel | |
| 8,619,267 B2 | 12/2013 | Wong | |
| 8,735,795 B2 * | 5/2014 | Qiao et al. | 250/208.1 |
| 2006/0237540 A1 | 10/2006 | Saxena | |
| 2007/0257767 A1 | 11/2007 | Beeson | |
| 2008/0012085 A1 | 1/2008 | Cheng | |
| 2008/0122803 A1 | 5/2008 | Izadi | |
| 2009/0034081 A1 | 2/2009 | Chu | |
| 2009/0045498 A1 | 2/2009 | Braden | |
| 2009/0256216 A1 | 10/2009 | Kierse | |
| 2009/0256931 A1 | 10/2009 | Lee | |
| 2010/0171027 A1 | 7/2010 | Yun | |
| 2010/0181578 A1 | 7/2010 | Li | |
| 2011/0057102 A1 | 3/2011 | Yao | |
| 2011/0068270 A1 | 3/2011 | Shin | |
| 2011/0204209 A1 | 8/2011 | Barrows | |
| 2011/0204233 A1 | 8/2011 | Costello | |
| 2011/0248172 A1 | 10/2011 | Rueger | |
| 2011/0254864 A1 | 10/2011 | Tsuchikawa | |
| 2011/0260176 A1 | 10/2011 | Onoe | |
| 2012/0080764 A1 | 4/2012 | Xue | |
| 2012/0256892 A1 * | 10/2012 | Hung et al. | 345/207 |
| 2012/0262421 A1 | 10/2012 | Kao | |
| 2012/0265471 A1 | 10/2012 | Hess | |
| 2012/0284442 A1 * | 11/2012 | Card | 710/260 |
| 2013/0026591 A1 | 1/2013 | Iwafuchi | |
| 2013/0044380 A1 | 2/2013 | Shen | |
| 2013/0076695 A1 | 3/2013 | Gomez | |
| 2013/0093708 A1 | 4/2013 | Annett | |
| 2013/0341650 A1 | 12/2013 | Peng | |
| 2014/0014839 A1 * | 1/2014 | Chang et al. | 250/338.4 |
| 2014/0118257 A1 | 5/2014 | Baldwin | |
| 2014/0319348 A1 | 10/2014 | Hsieh | |
| 2014/0325109 A1 * | 10/2014 | Zhan | 710/263 |
| 2014/0361200 A1 | 12/2014 | Rudmann | |
| 2015/0028360 A1 | 1/2015 | Tu | |

FOREIGN PATENT DOCUMENTS

| | | |
|---|---|---|
| CN | 101039381 A | 9/2007 |
| CN | 101063742 A | 10/2007 |
| CN | 101509787 A | 8/2009 |
| CN | 101539651 A | 9/2009 |
| CN | 101795128 A | 8/2010 |
| CN | 101901083 A | 12/2010 |
| CN | 101953154 A | 1/2011 |
| CN | 102055844 A | 5/2011 |
| CN | 201845786 U | 5/2011 |
| CN | 201853708 U | 6/2011 |
| CN | 102194835 A | 9/2011 |
| CN | 102221939 A | 10/2011 |
| CN | 102736794 A | 10/2012 |
| CN | 102809876 A | 12/2012 |
| CN | 102867836 A | 1/2013 |
| CN | 102934060 A | 2/2013 |
| CN | 102999225 A | 3/2013 |
| CN | 103066080 A | 4/2013 |
| DE | 2146 377 | 3/1973 |
| DE | 10 2007 023 893 A1 | 11/2008 |
| EP | 1 811 772 A2 | 7/2007 |
| TW | 200846996 | 12/2008 |
| TW | 201109976 A1 | 3/2011 |
| WO | 2009144685 A2 | 12/2009 |

* cited by examiner

METHOD OF INTERRUPT CONTROL AND ELECTRONIC SYSTEM USING THE SAME

CROSS REFERENCE TO RELATED APPLICATIONS

This application claims the benefit of U.S. Provisional Application No. 61/817,306, which was filed on Apr. 29, 2013 and titled "3D-Motion Gesture/Proximity Detection Module Sensor (MGPS)", the contents of which are incorporated herein by reference.

BACKGROUND OF THE INVENTION

1. Field of the Invention

The present invention relates to a method of interrupt control and an electronic system using the same, and more particularly, to a method of interrupt control and an electronic system capable of assisting a host to receive data.

2. Description of the Prior Art

With advancements in technology, various electronic devices such as mobile phones, GPS navigator systems, tablets, personal digital assistants (PDA) and laptops have become indispensable in our daily life. A standard electronic system comprises a core processor such as a central processing unit (CPU), a microprocessor or a micro control unit (MCU). The core processor is utilized for managing and coordinating operations of every device in the electronic system. Since most devices need the processor to perform data processing, the load of the processor is heavy. If the processor performance is poor or a large number of tasks suddenly arrive, the processor may not be able to accomplish all tasks in time, resulting in a bottleneck of system performance.

The industry has made a lot of effort to enhance the performance of electronic systems by developing more powerful processors as well as reducing their load. If powerful dual-core or quad-core processors are utilized, costs will increase necessarily without a guarantee that the performance can be doubled or quadrupled. More methods to reduce the processor load have therefore been developed, of which one is the interrupt control method. In the interrupt control method, an interrupt signal is sent to the processor only when there is a task to be executed in a device. Upon receiving the interrupt signal, the processor allocates resources to execute said tasks. In such a situation, the processor may not need to keep detecting the operations of every device; instead, the processor only allocates resources to a specific device after receiving the interrupt signal from the device. The load of the processor will be significantly reduced. Current methods of sending interrupt signals, however, cannot effectively and accurately send interrupt signals when a task needs to be executed in the device. Thus, there is a need for improvement over the prior art.

SUMMARY OF THE INVENTION

It is therefore an objective of the present invention to provide a method of interrupt control and an electronic system using the same, which is capable of controlling an electronic device of the electronic system to effectively and accurately send interrupt signals, in order to enhance the efficiency of a processor of the electronic system.

The present invention discloses a method of interrupt control for a control unit of an electronic system. The electronic system comprises a host and an electronic device. The interrupt control method comprises receiving digital data generated by the electronic device; determining a value of the digital data; and sending interrupt signals to the host by the following methods according to the value of the digital data: when the control unit is in a second signal sending status and after the value of the digital data increases to be greater than a first threshold value and remains greater than the first threshold value for a first specific period of time, the control unit is switched to a first signal sending status; and when the control unit is in the first signal sending status and after the value of the digital data reduces to be smaller than a second threshold value and remains smaller than the second threshold value for a second specific period of time, the control unit is switched to the second signal sending status; wherein the second threshold value is smaller than the first threshold value.

The present invention further discloses an electronic system. The electronic system comprises a host; an electronic device, for generating digital data; and a control unit. The control unit has a program executed by a processor for performing a method of interrupt control, wherein the method comprises receiving the digital data generated by the electronic device; determining a value of the digital data; and sending interrupt signals to the host by the following methods according to the value of the digital data: when the control unit is in a second signal sending status and after the value of the digital data increases to be greater than a first threshold value and remains greater than the first threshold value for a first specific period of time, the control unit is switched to a first signal sending status; and when the control unit is in the first signal sending status and after the value of the digital data reduces to be smaller than a second threshold value and remains smaller than the second threshold value for a second specific period of time, the control unit is switched to the second signal sending status; wherein the second threshold value is smaller than the first threshold value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
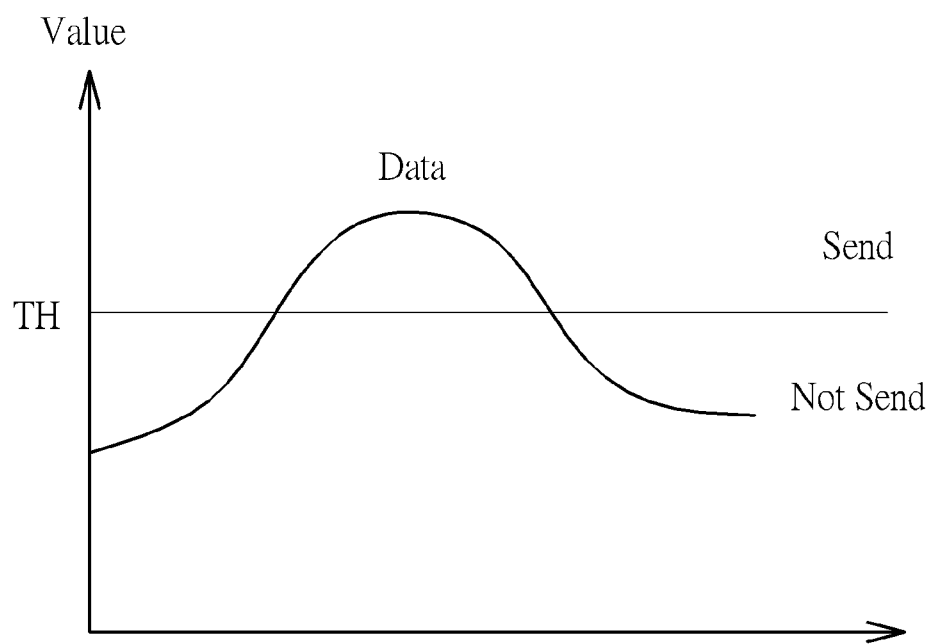
FIG. 1 is a schematic diagram of a common interrupt signal sending status.

As mentioned above, current methods of sending interrupt signals cannot effectively and accurately send the interrupt signals when a task needs to be executed in the device. Please refer to FIG. 1, which is a schematic diagram of a common interrupt signal sending status. As shown in FIG. 1, a device may determine whether to send interrupt signals according to a value of data. When the value of the data is greater than a threshold value TH, the device may continue to send interrupt signals to inform the processor to execute the task. When the value of the data is smaller than the threshold value TH, the device may stop sending the interrupt signals, so the processor does not need to waste resources on detecting whether there are any tasks to be executed. In this interrupt signal sending policy, when the value of the data is close to the threshold value TH, noise in the system may cause the device to inaccurately send interrupt signals; alternatively, an interrupt signal needs to be sent but is not sent due to this noise interference.

Figure 2:
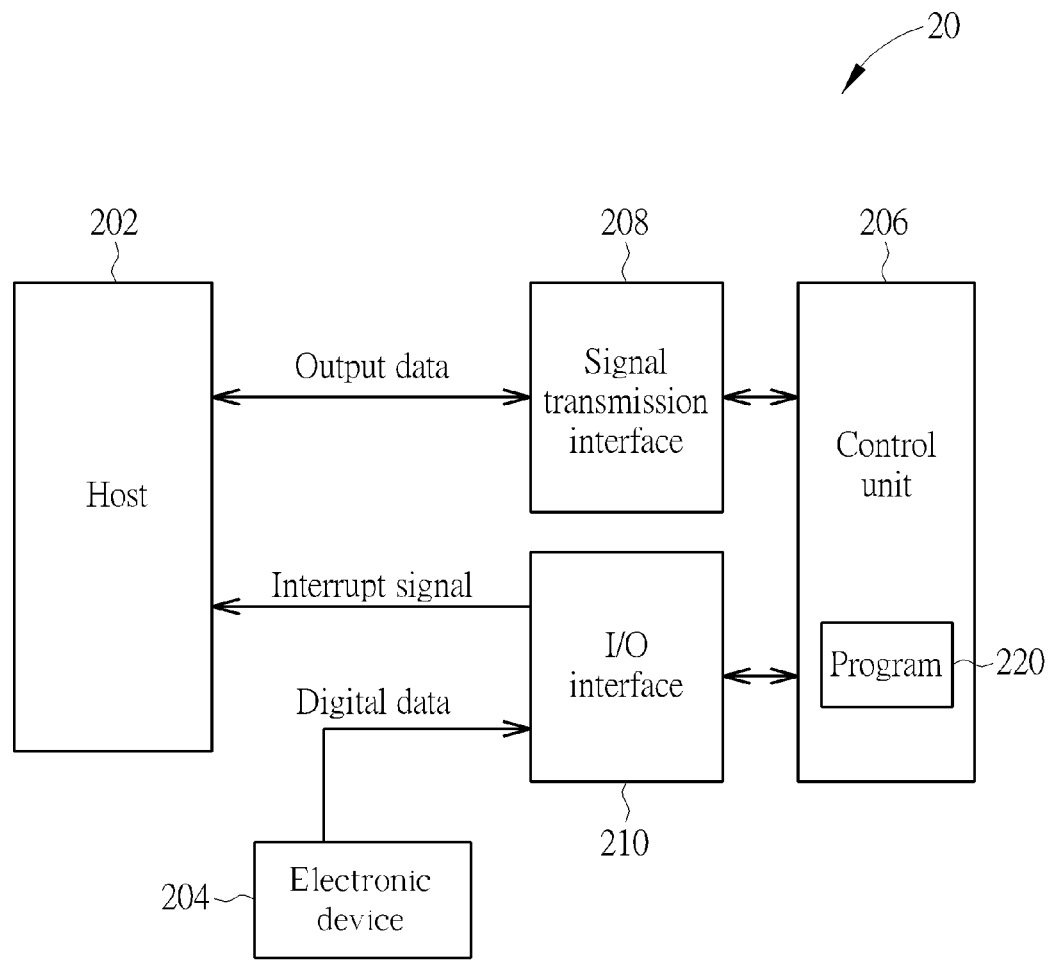
FIG. 2 is a schematic diagram of an electronic system according to an embodiment of the present invention.

Please refer to FIG. 2, which is a schematic diagram of an electronic system 20 according to an embodiment of the present invention. The electronic system 20 includes a host 202, an electronic device 204, a control unit 206, a signal transmission interface 208 and an I/O interface 210. The host 202 is utilized for controlling operations of each device in the electronic system 20. In general, the host 202 may be a core processor of the electronic system 20 such as a central processing unit (CPU), a microprocessor or a micro control unit (MCU). The electronic device 204, which is a device capable of executing specific functions, is controlled by the host 202. When the electronic device 204 is operating, digital data may be generated, and these digital data may be converted into output data to be transmitted to the host 202 for follow-up processing. The control unit 206 is utilized for receiving the digital data generated by the electronic device 204 via the I/O interface 210. The control unit 206 may convert these digital data into the output data, which are then transmitted to the host 202 via the signal transmitting interface 208. The control unit 206 further sends the interrupt signals to the host 202 via the I/O interface 210. When the host 202 receives the interrupt signals, the host 202 may interrupt ongoing tasks and allocate resources to receive the output data.

Please note that the abovementioned signal transmitting interface 208 and I/O interface 210 are utilized for performing connections and signal transmissions between each device. The implementation illustrated in FIG. 2 is only one of various embodiments. For example, the signal transmitting interface 208 and the I/O interface 210 may be realized in the electronic system 20 separately. The signal transmitting interface 208 and the I/O interface 210 may also be integrated into the control unit 206, or integrated into the host 202. The electronic system 20 may also use a transmission interface to integrate the functions of both the signal transmitting interface 208 and the I/O interface 210. In other words, the control unit 206 may be connected with other devices and signals may be transmitted via other interfaces or by other methods, which are not limited herein.

In detail, the control unit 206 may have a program 220, which is executed by a processor inside the control unit 206, in order to perform an interrupt control method. The interrupt control method of the present invention can be utilized for controlling the timing of sending the interrupt signals and preventing the interrupt signals from being sent inaccurately due to noise interference, so that the host 202 can efficiently obtain the output data of the electronic device 204. This further reduces the load of the host 202 and enhances the efficiency of the host 202.

Figure 3:
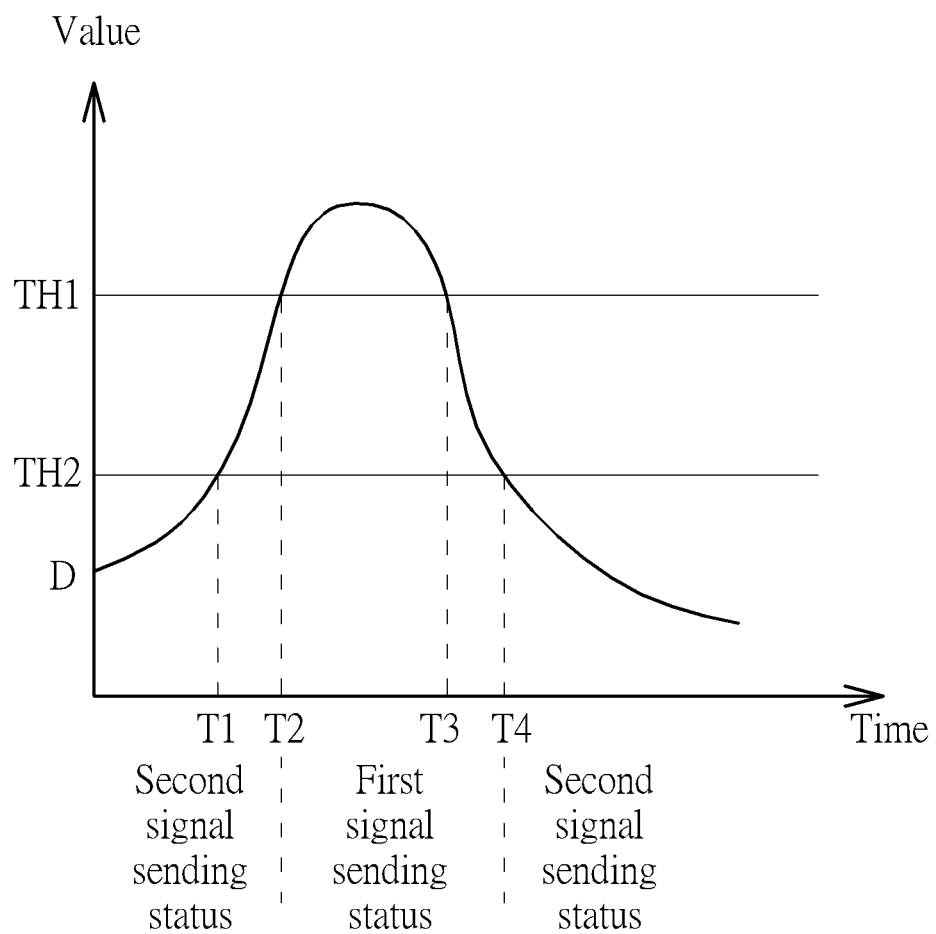
FIG. 3 is a schematic diagram of an interrupt signal sending status according to an embodiment of the present invention.

Please refer to FIG. 3, which is a schematic diagram of an interrupt signal sending status according to an embodiment of the present invention. As shown in FIG. 3, the control unit 206 defines a first threshold value TH1 and a second threshold value TH2, where the second threshold value TH2 is smaller than the first threshold value TH1. The control unit 206 receives digital data D generated by the electronic device 204, and determines the value of the digital data D. The control unit 206 then compares the value of the digital data D with the first threshold value TH1 and the second threshold value TH2, in order to determine whether the control unit 206 is in a first signal sending status or a second signal sending status.

In an embodiment, in the first signal sending status, the control unit 206 may continue to send the interrupt signals to the host 202, in order to notify the host to access the output data corresponding to the digital data D. In the second signal sending status, the control unit 206 may not send the interrupt signals to the host 202, so that the host 202 may allocate resources to other devices and does not need to waste resources on detecting whether there is a task to be processed in the electronic device 204. Initially, the control unit 206 may be predefined to be in the second signal sending status and may not send the interrupt signals, as shown in FIG. 3. At this moment, if the value of the digital data D is smaller than the first threshold value TH1, the control unit 206 is still in the second signal sending status and may not send the interrupt signals. Even if the digital data D increases to be greater than the second threshold value TH2 (e.g. at time T1), the control unit 206 will not change its status. When the digital data D increases to be greater than the first threshold value TH1 (e.g. time T2), the control unit 206 may be switched to the first signal sending status and start to send the interrupt signals to the host 202. Since the control unit 206 starts to send the interrupt signals after the digital data D rises to the higher first threshold value TH1, it is harder for the digital data D to trigger the control unit 206 to the first signal sending status when noise causes signal fluctuations, so that inaccurate sending of the interrupt signals may be reduced.

When the value of the digital data D remains greater than the first threshold value TH1, the control unit 206 remains in the first signal sending status and therefore continues to send the interrupt signals to the host 202. When the value of the digital data D reduces to be smaller than the first threshold value TH1 (e.g. time T3), the digital data D is still greater than the second threshold value TH2, so that the control unit 206 is still in the first signal sending status and continues to send the interrupt signals. When the digital data D keeps decreasing and falls to be smaller than the second threshold value TH2 (e.g. time T4), the control unit 206 may be switched to the second signal sending status and thereby stop sending the interrupt signals to the host 202. Since the control unit 206 changes status after the digital data D falls to the lower second threshold value TH2, it is harder for the digital data D to trigger the control unit 206 to the second signal sending status when noise causes signal fluctuations, so that the possibility that the control unit 206 has to send the interrupt signals but does not send them may be reduced.

Figure 4:
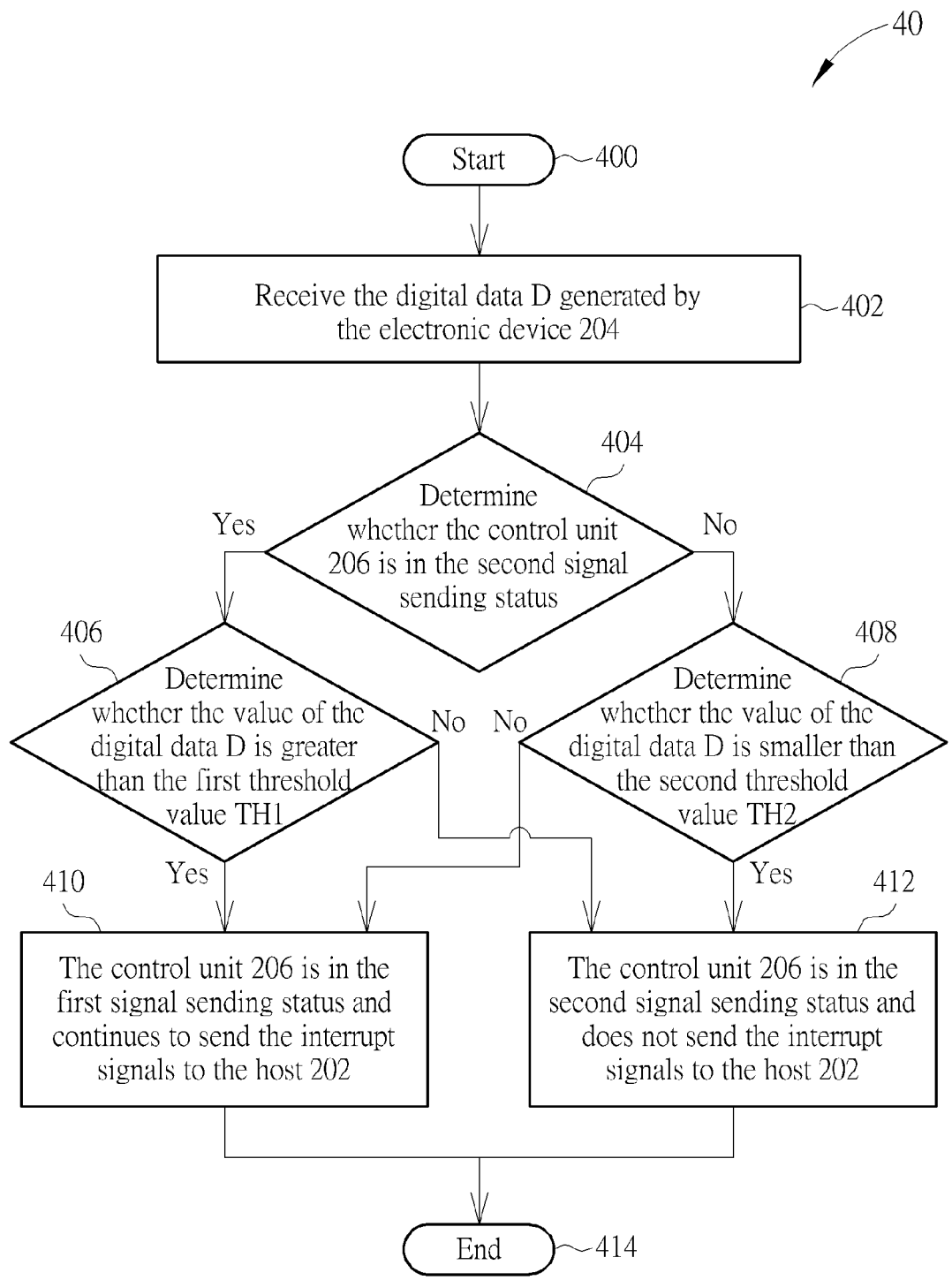
FIG. 4 is a schematic diagram of an interrupt signal sending process according to an embodiment of the present invention.

The above operations related to the method of sending interrupt signals can be summarized into an interrupt signal sending process 40, as shown in FIG. 4. The interrupt signal sending process 40, which can be compiled into the program 220 to be executed by the processor in the control unit 206, includes the following steps:

Step 400: Start.

Step 402: Receive the digital data D generated by the electronic device 204.

Step 404: Determine whether the control unit 206 is in the second signal sending status. If yes, go to Step 406; otherwise, go to Step 408.

Step 406: Determine whether the value of the digital data D is greater than the first threshold value TH1. If yes, go to Step 410; otherwise, go to Step 412.

Step 408: Determine whether the value of the digital data D is smaller than the second threshold value TH2. If yes, go to Step 412; otherwise, go to Step 410.

Step 410: The control unit 206 is in the first signal sending status and continues to send the interrupt signals to the host 202.

Step 412: The control unit 206 is in the second signal sending status and does not send the interrupt signals to the host 202.

Step 414: End.

In the interrupt signal sending process 40, the determinations of sending the interrupt signals can be simplified to the following methods: when the control unit 206 is in the second signal sending status, only determine whether the value of the digital data D is greater than the first threshold value TH1. When the value of the digital data D is determined to be greater than the first threshold value TH1, the control unit 206 is then switched to the first signal sending status. When the control unit 206 is in the first signal sending status, only determine whether the value of the digital data D is smaller than the second threshold value TH2. When the value of the digital data D is determined to be smaller than the second threshold value TH2, the control unit 206 is then switched to the second signal sending status.

In another embodiment, the control unit 206 is switched to the first signal sending status after the value of the digital data D rises to be greater than the first threshold value TH1 and further remains greater than the first threshold value TH1 for a period of time, in order to prevent the control unit 206 from inaccurately sending the interrupt signals due to noise interference. The value of the digital data D has to remain above the first threshold value TH1 for a specific period of time before the control unit 206 is switched to the first signal sending status and starts to send the interrupt signals to the host 202. The specific period of time may be, but should not be limited to, any length of time determined according to system requirements. In such a situation, after the value of the digital data D rises and exceeds the first threshold value TH1, if the value of the digital data D falls below the first threshold value TH1 within the specific period of time. Such rising and falling may be considered as fluctuations caused by noise interference, and the control unit 206 may not be triggered to change status. At this moment, the control unit 206 may still remain in the second signal sending status and may not send the interrupt signals to the host 202.

Similarly, the control unit 206 is switched to the second signal sending status after the value of the digital data D falls to be smaller than the second threshold value TH2 and remains smaller than the second threshold value TH2 for a period of time. The value of the digital data D has to remain below the second threshold value TH2 for a specific period of time before the control unit 206 is switched to the second signal sending status and stops sending the interrupt signals to the host 202. The length of the specific period of time described herein may be the same as or different from the length of the abovementioned period for determining whether to switch the control unit 206 to the first signal sending status, which may be determined according to system requirements. In such a situation, after the value of the digital data D falls to be smaller than the second threshold value TH2, if the value of the digital data D returns to be greater than the second threshold value TH2 within the specific period of time. Such rising and falling may be considered as fluctuations caused by noise interference, and the control unit 206 may not be triggered to change status. At this moment, the control unit 206 may still remain in the first signal sending status and may keep sending the interrupt signals to the host 202.

Please note that the control unit of the present invention is capable of accurately sending the interrupt signals to the host and preventing the noise interference from causing the interrupt signals to be sent inaccurately. Those skilled in the art can make modifications and alternations accordingly. For example, the magnitudes of the first threshold value TH1 and the second threshold value TH2 may be defined to be a suitable value according to system requirements, which allows the control unit 206 to accurately change status. The electronic device 204 may be any devices in the electronic system 20 that can be controlled by the host 202, which should not be limited to particular types or those devices which have particular functions. In other words, any peripheral devices managed by the host 202 may utilize the abovementioned methods of sending interrupt signals to prevent noise interference from causing the signals to be sent inaccurately. Therefore, the host 202 may not need to keep detecting operations of every device; instead, the host 202 may allocate resources to process tasks in the specific device only when receiving the interrupt signals.

For example, in an embodiment, the electronic device 204 may be a light sensor, and the digital data may be related to a sensing result of ambient lights. The host 202 may not need to keep receiving the data sensed by the light sensor; instead, after the light sensor obtains the sensing result, the sensing result is transmitted to the control unit 206. The control unit 206 then determines when to start sending the interrupt signals according to the value of the sensing result, e.g. defining an effective sensing result to be a value greater than the first threshold value TH1 and remaining above the first threshold value TH1 for a period of time. When the effective sensing result is detected, the control unit 206 may start to send the interrupt signals to the host 202, in order to notify the host 202 to receive data.

In the above embodiment, in the first signal sending status, the control unit 206 may continue to send the interrupt signals to the host 202, in order to notify the host 202 to access the output data corresponding to the digital data D. In the second signal sending status, the control unit 206 may not send the interrupt signals to the host 202, so that the host 202 may allocate resources to other devices, wherein no resources are wasted in detecting whether there is a task to be processed in the electronic device 204. In another embodiment, the control unit 206 may be controlled to continue to send the interrupt signals to the host 202 in the second signal sending status to notify the host 202 to access the output data corresponding to the digital data D, while the control unit 206 may not send the interrupt signals to the host 202 in the first signal sending status, so that the host 202 may allocate resources to other devices. In this way, no resources are wasted in detecting whether there is a task to be processed in the electronic device 204.

The methods of switching between the first signal sending status and the second signal sending status are still the same as the method shown in FIG. 3, wherein the control unit 206 does not send the interrupt signals in the first signal sending status and continues to send the interrupt signals to the host 202 in the second signal sending status. Such setting of interrupt signal sending may also be incorporated with the abovementioned methods that require a status to be constant for a specific period of time. For example, if the control unit 206 is in the second signal sending status, the control unit 206 may be switched to the first signal sending status and stop sending the interrupt signals only after the value of the digital data D remains above the first threshold value TH1 for a specific period of time. If the control unit 206 is in the first signal sending status, the control unit 206 may be switched to the second signal sending status and start to send the interrupt signals to the host 202 only after the value of the digital data D remains below the second threshold value TH2 for a specific period of time. As a result, the conditions that the interrupt signals are sent inaccurately or that the interrupt signals which should be sent but are not sent due to noise interference may be prevented.

The above signal sending methods switch between two signal sending statuses, wherein the interrupt signals are sent continuously in one of the statuses and are not sent in the other one. In another embodiment, the methods of sending interrupt signals related to the first signal sending status and the second signal sending status may also be performed by other methods, which are not limited herein. For example, for a specific type of electronic device, the control unit 206 may not need to keep sending the interrupt signals; instead, the control unit 206 sends an interrupt signal when changing status. In detail, the control unit 206 may send an interrupt signal to the host 202, in order to notify the host 202 to access the output data corresponding to the digital data D when the control unit 206 is switched from the second signal sending status to the first signal sending status. The control unit 206 may also send an interrupt signal to the host 202 to notify the host 202 to access the output data corresponding to the digital data D when switching from the first signal sending status to the second signal sending status. In this embodiment, the methods of switching between the first signal sending status and the second signal sending status are still the same as the method shown in FIG. 3, but the control unit 206 only sends an interrupt signal when changing status instead of continuing to send interrupt signals.

Please note that, since the host 202 allocates resources to access the output data of the electronic device 204 only when necessary, the sending of the interrupt signals may be adjusted according to different types of electronic devices or different types of output data, which should be determined according to system requirements.

In the prior art, conventional methods of sending interrupt signals cannot effectively and accurately send interrupt signals when a task needs to be executed in the device. If noise occurs, the noise may cause the device to inaccurately send interrupt signals, or an interrupt signal may need to be sent but is not sent due to the noise interference. In comparison, the interrupt control method and electronic system of the present invention determines the timing of sending interrupt signals by using two threshold values. This is able to effectively and accurately send the interrupt signals so that efficiency of the host is enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of interrupt control for a control unit of an electronic system, the electronic system comprising a host and an electronic device, the interrupt control method comprising:
   receiving digital data generated by the electronic device;
   determining a value of the digital data; and
   sending interrupt signals to the host by the following methods according to the value of the digital data:
      when the control unit is in a second signal sending status and after the value of the digital data increases to be greater than a first threshold value and remains greater than the first threshold value for a first specific period of time, switching the control unit to a first signal sending status; and
      when the control unit is in the first signal sending status and after the value of the digital data reduces to be smaller than a second threshold value and remains smaller than the second threshold value for a second specific period of time, switching the control unit to the second signal sending status;
   wherein the second threshold value is smaller than the first threshold value;
   wherein when the control unit is in one of the first signal sending status and the second signal sending status, continuing to send the interrupt signals to the host, and when the control unit is in the other of the first signal sending status and the second signal sending status, not sending the interrupt signals to the host.

2. The method of claim 1, wherein when the control unit is switched from the second signal sending status to the first signal sending status, sending a first interrupt signal to the host, and when the control unit is switched from the first signal sending status to the second signal sending status, sending a second interrupt signal to the host.

3. The method of claim 1, wherein the interrupt signals control the host to interrupt an ongoing task in order to allow the host to receive an output data corresponding to the digital data.

4. The method of claim 1, wherein the electronic device is a light sensor, and the digital data correspond to a sensing result of ambient lights.

5. The method of claim 1, wherein when the control unit is in the first signal sending status, and the value of the digital data reduces to be smaller than the first threshold value but is greater than the second threshold value, not switching the control unit to the second signal sending status.

6. The method of claim 1, wherein when the control unit is in the second signal sending status, and the value of the digital data increases to be greater than the second threshold value but is smaller than the first threshold value, not switching the control unit to the first signal sending status.

7. An electronic system, comprising:
   a host;
   an electronic device, for generating digital data; and
   a control unit, having a program executed by a processor for performing a method of interrupt control, the method comprising:
      receiving the digital data generated by the electronic device;
      determining a value of the digital data; and
      sending interrupt signals to the host by the following methods according to the value of the digital data:
         when the control unit is in a second signal sending status and after the value of the digital data increases to be greater than a first threshold value and remains greater than the first threshold value for a first specific period of time, switching the control unit to a first signal sending status; and
         when the control unit is in the first signal sending status and after the value of the digital data reduces to be smaller than a second threshold value and remains smaller than the second threshold value for a second specific period of time, switching the control unit to the second signal sending status;
      wherein the second threshold value is smaller than the first threshold value;

wherein when the control unit is in one of the first signal sending status and the second signal sending status, the interrupt signals continue to be sent to the host, and when the control unit is in the other of the first signal sending status and the second signal sending status, the interrupt signals are not sent to the host.

8. The electronic system of claim 7, wherein when the control unit is switched from the second signal sending status to the first signal sending status, a first interrupt signal is sent to the host, and when the control unit is switched from the first signal sending status to the second signal sending status, a second interrupt signal is sent to the host.

9. The electronic system of claim 7, wherein the interrupt signals control the host to interrupt an ongoing task in order to allow the host to receive an output data corresponding to the digital data.

10. The electronic system of claim 7, wherein the electronic device is a light sensor, and the digital data correspond to a sensing result of ambient lights.

11. The electronic system of claim 7, wherein when the control unit is in the first signal sending status, and the value of the digital data reduces to be smaller than the first threshold value but is greater than the second threshold value, the control unit is not switched to the second signal sending status.

12. The electronic system of claim 7, wherein when the control unit is in the second signal sending status, and the value of the digital data increases to be greater than the second threshold value but is smaller than the first threshold value, the control unit is not switched to the first signal sending status.

* * * * *